(12) United States Patent
Su et al.

(10) Patent No.: US 11,750,004 B2
(45) Date of Patent: Sep. 5, 2023

(54) BATTERY MANAGEMENT SYSTEM AND BATTERY MANAGEMENT METHOD

(71) Applicant: APh ePower Co., Ltd., Kaohsiung (TW)

(72) Inventors: Hsiu-Hsien Su, Kaohsiung (TW);
Bin-Hao Chen, Kaohsiung (TW);
Guan-Ru Jiang, Kaohsiung (TW);
Yi-Xiang Lai, Kaohsiung (TW)

(73) Assignee: APh ePower Co., Ltd., Kaohsiung (TW)

( * ) Notice: Subject to any disclaimer, the term of this patent is extended or adjusted under 35 U.S.C. 154(b) by 0 days.

(21) Appl. No.: 17/975,553

(22) Filed: Oct. 27, 2022

(65) Prior Publication Data
US 2023/0208167 A1 Jun. 29, 2023

(30) Foreign Application Priority Data
Dec. 23, 2021 (TW) .................. 110148502

(51) Int. Cl.
*H02J 7/00* (2006.01)
*G01R 31/367* (2019.01)
(Continued)

(52) U.S. Cl.
CPC .......... *H02J 7/0047* (2013.01); *G01R 31/367* (2019.01); *G01R 31/388* (2019.01); *H01M 10/425* (2013.01); *H01M 10/482* (2013.01); *H01M 10/486* (2013.01); *H02J 7/0014* (2013.01); *H02J 7/00304* (2020.01); *H02J 7/00308* (2020.01); *H02J 7/00309* (2020.01); *H02J 7/00711* (2020.01); *H02J 7/00714* (2020.01); *H02J 7/007182* (2020.01);
(Continued)

(58) Field of Classification Search
USPC ......................................... 320/118, 132, 134
See application file for complete search history.

(56) References Cited

U.S. PATENT DOCUMENTS 9,599,675 B2 * 3/2017 Yun ..................... G01R 31/367
9,709,635 B2 * 7/2017 Zhong ................ G01R 31/3828
(Continued)

FOREIGN PATENT DOCUMENTS

CN 109061521 12/2018

*Primary Examiner* — Samuel Berhanu
(74) *Attorney, Agent, or Firm* — JCIPRNET

(57) ABSTRACT

A battery management system and a battery management method are provided. The battery management system includes a temperature sampling circuit, a plurality of voltage measurement circuits, a current sampling circuit, and a microcontroller. The temperature sampling circuit is configured to obtain a temperature parameter of a plurality of battery packs. The voltage measurement circuits are configured to obtain a plurality of open circuit voltage parameters of the battery packs. The current sampling circuit is configured to obtain a current parameter of the battery packs. The microcontroller obtains a plurality of initial state-of-charge parameters of the battery packs according to the open circuit voltage parameters and the temperature parameter and respectively calculates a plurality of present battery powers of the battery packs according to the initial state-of-charge parameters, the temperature parameter, and the current parameter.

19 Claims, 7 Drawing Sheets

(51) Int. Cl.
*G01R 31/388* (2019.01)
*H01M 10/42* (2006.01)
*H01M 10/48* (2006.01)

(52) U.S. Cl.
CPC ............... *H02J 7/007194* (2020.01); *H01M 2010/4271* (2013.01)

(56) References Cited

U.S. PATENT DOCUMENTS

| | | | |
|---|---|---|---|
| 9,869,724 B2 * | 1/2018 | Kimura | G01R 31/3835 |
| 2001/0035737 A1 * | 11/2001 | Nakanishi | G01R 31/392 |
| | | | 320/122 |
| 2019/0023132 A1 * | 1/2019 | Yonemoto | H01M 10/42 |

* cited by examiner

BATTERY MANAGEMENT SYSTEM AND BATTERY MANAGEMENT METHOD

CROSS-REFERENCE TO RELATED APPLICATION

This application claims the priority benefit of Taiwan application serial no. 110148502, filed on Dec. 23, 2021. The entirety of the above-mentioned patent application is hereby incorporated by reference herein and made a part of this specification.

BACKGROUND

Technical Field

The disclosure relates to a battery management technology, and in particular relates to a battery management system and a battery management method.

Description of Related Art

With the trend of the energy development, storage batteries are widely applied to application requirements of diverse fields, and how to effectively manage and protect the use of storage batteries is one of the important researches and development focuses nowadays. However, the traditional battery management method mostly performs power management and protection on the single cell only, or only uses a specific battery connected in series or connected in parallel to monitor the battery, so that the effective battery management and protection for the battery application field of common high voltage battery packs cannot be performed.

In this regard, multiple cells are required for the high voltage battery packs to be connected in series to increase the terminal voltage of the battery packs to enable the high voltage battery packs to meet the rated voltage required by the load. Nonetheless, since there are slight differences between the cells due to internal resistance, thereby the terminal voltage of each cell is not exactly the same, and the capacity and internal resistance of each cell may be different. In this way, in the process of the charge movement of the battery packs during the charge and the discharge period, there is the possibility to cause the terminal voltage of a certain cell in the battery packs to exceed or be lower than the threshold voltage, but the traditional battery management system cannot perform the response based on instantaneous or accurate judgement of the battery state of each cell. Therefore, the safety and lifetime of the battery packs are often reduced.

SUMMARY

The disclosure provides a battery management system and a battery management method, which can accurately estimate multiple present battery powers of multiple battery packs.

A battery management system of the disclosure includes a temperature sampling circuit, multiple voltage measurement circuits, a current sampling circuit, and a microcontroller. The temperature sampling circuit is configured to obtain a temperature parameter of multiple battery packs. The voltage measurement circuits are respectively coupled to the battery packs and are configured to obtain multiple open circuit voltage parameters of the battery packs. The current sampling circuit is coupled to the battery packs and is configured to obtain a current parameter of the battery packs. The microcontroller is coupled to the voltage measurement circuits, the current sampling circuit, and the temperature sampling circuit. The microcontroller obtains multiple initial state-of-charge parameters of the battery packs according to the open circuit voltage parameters and the temperature parameter and respectively calculates multiple present battery powers of the battery packs according to the initial state-of-charge parameters, the temperature parameter, and the current parameter.

A battery management method of the disclosure includes the following steps: obtaining a temperature parameter of multiple battery packs through a temperature sampling circuit; obtaining multiple open circuit voltage parameters of the battery packs through multiple voltage measurement circuits; obtaining multiple initial state-of-charge parameters of the battery packs through a microcontroller according to the open circuit voltage parameters and the temperature parameter; obtaining a current parameter of the battery packs through a current sampling circuit; and respectively calculating multiple present battery powers of the battery packs through the microcontroller according to the initial state-of-charge parameters, the temperature parameter, and the current parameter.

Based on the above, the battery management system and the battery management method of the disclosure can accurately estimate the respective initial state of charge of the battery packs at the present battery temperature as the battery temperature changes, so that the present battery powers of the battery packs can be precisely calculated. In addition, the battery management system and the battery management method of the disclosure can keep updating the present battery powers of the battery packs to effectively achieve relevant battery protection mechanisms.

To make the aforementioned more comprehensible, several embodiments accompanied with drawings are described in detail as follows.

DESCRIPTION OF THE EMBODIMENTS

Figure 1:
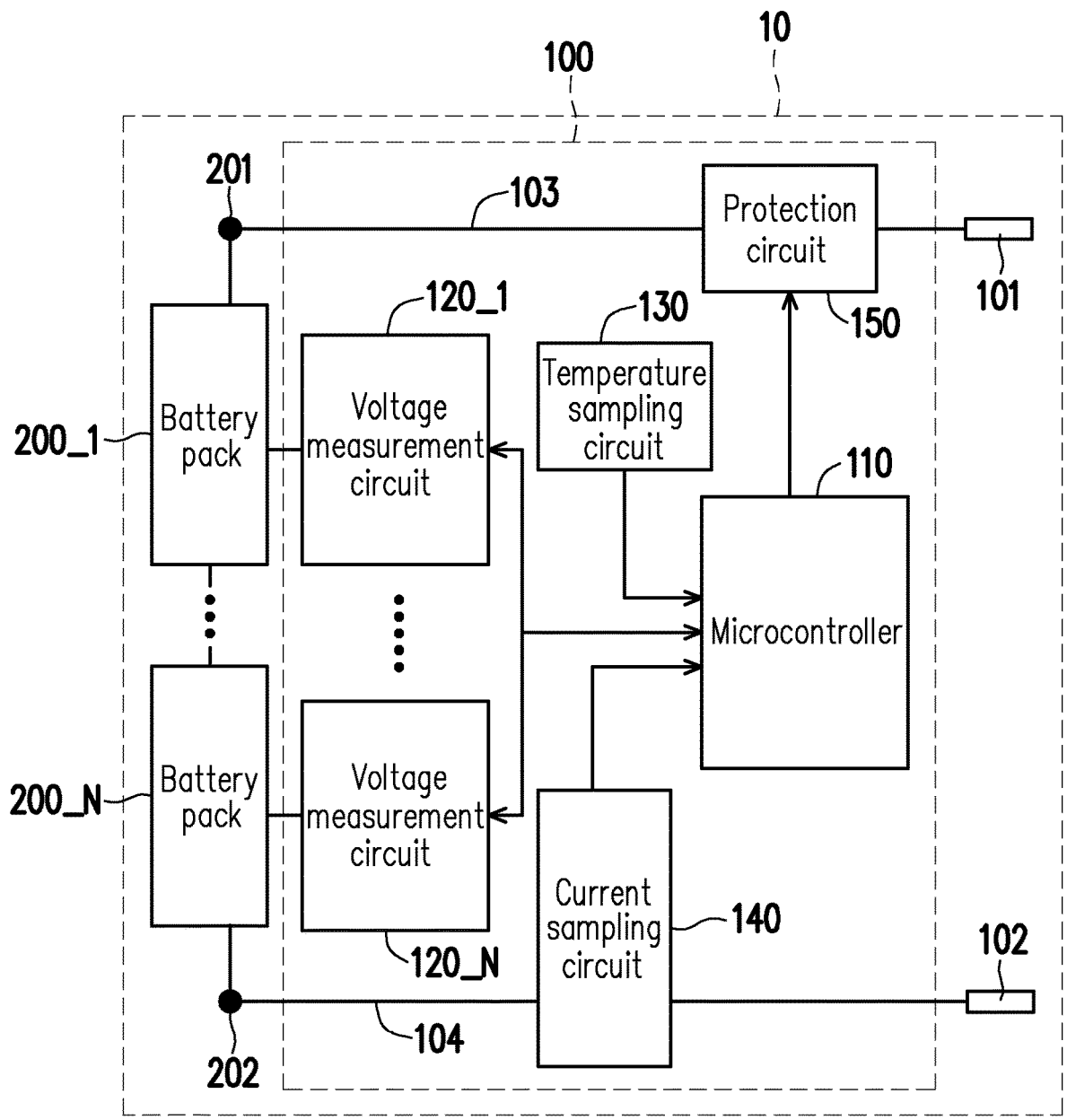
FIG. 1 is a schematic view of a battery management system according to an embodiment of the disclosure.

To provide a further understanding of the content of the disclosure, the following embodiments are used as examples based on which the disclosure may be realized. In addition, wherever possible, elements/components/steps with the same reference numeral in the drawings and embodiments represent the same or similar components.

FIG. 1 is a schematic view of a battery management system according to an embodiment of the disclosure. Referring to FIG. 1, a battery management system 100 includes a microcontroller 110, multiple voltage measurement circuits 120_1 to 120_N, a temperature sampling circuit 130, a current sampling circuit 140, and a protection circuit 150, where N is a positive integer. The battery management system 100 may be disposed in a battery module 10 and may be coupled to (or may be electrically connected to) multiple battery packs 200_1 to 200_N to manage a battery state of the battery packs 200_1~200_N. In the embodiment, the microcontroller 110 is coupled to the voltage measurement circuits 120_1 to 120_N, the temperature sampling circuit 130, the current sampling circuit 140, and the protection circuit 150. The battery management system 100 is electrically connected between a load positive electrode 101 and a battery positive electrode 201 through a power line 103, and is electrically connected between a load negative electrode 102 and a battery negative electrode 202 through a power line 104. Besides, the battery packs 200_1 to 200_N may be coupled between the battery positive electrode 201 and the battery negative electrode 202. In the embodiment, the battery packs 200_1 to 200_N may respectively include multiple aluminum-ion batteries connected in series, but the disclosure is not limited thereto. In an embodiment, the battery packs 200_1 to 200_N may respectively include, but are not limited to, multiple aluminum capacitances connected in series, or various aluminum energy storage devices such as solid or liquid (electrolytic) capacitors, batteries, or supercapacitors made from the aluminum material. The battery management system and the battery management method provided in each of the embodiments of the disclosure may be applicable to various aluminum energy storage devices. Even in another embodiment, the battery packs 200_1 to 200_N may be respectively storage batteries or capacitors made from other materials.

In the embodiment, the voltage measurement circuits 120_1 to 120_N are respectively coupled to the battery packs 200_1 to 200_N one by one to respectively perform voltage measurements on the battery packs 200_1 to 200_N. The temperature sampling circuit 130 may be disposed on or connected to a periphery of the adjacent battery packs 200_1 to 200_N or battery components to effectively sense a present battery temperature of the battery packs 200_1 to 200_N. The current sampling circuit 140 may be coupled to the power line 104 and may measure a present current parameter of the battery packs 200_1 to 200_N. In the embodiment, the current sampling circuit 140 may have a function of bidirectional current measurement. In particular, the current sampling circuit 140 may be adapted to the characteristics of an aluminum-ion battery (or other aluminum energy storage devices, such as solid or liquid (electrolytic) capacitors, batteries, or supercapacitors made from the aluminum material) such as a high coulombic efficiency and an instantaneous high-power output. The protection circuit 150 may be coupled to the power line 103, and the microcontroller 110 may determine whether the power line 103 is conductive through controlling the protection circuit 150 to control whether the battery packs 200_1 to 200_N are to be charged or discharged.

Figure 2:
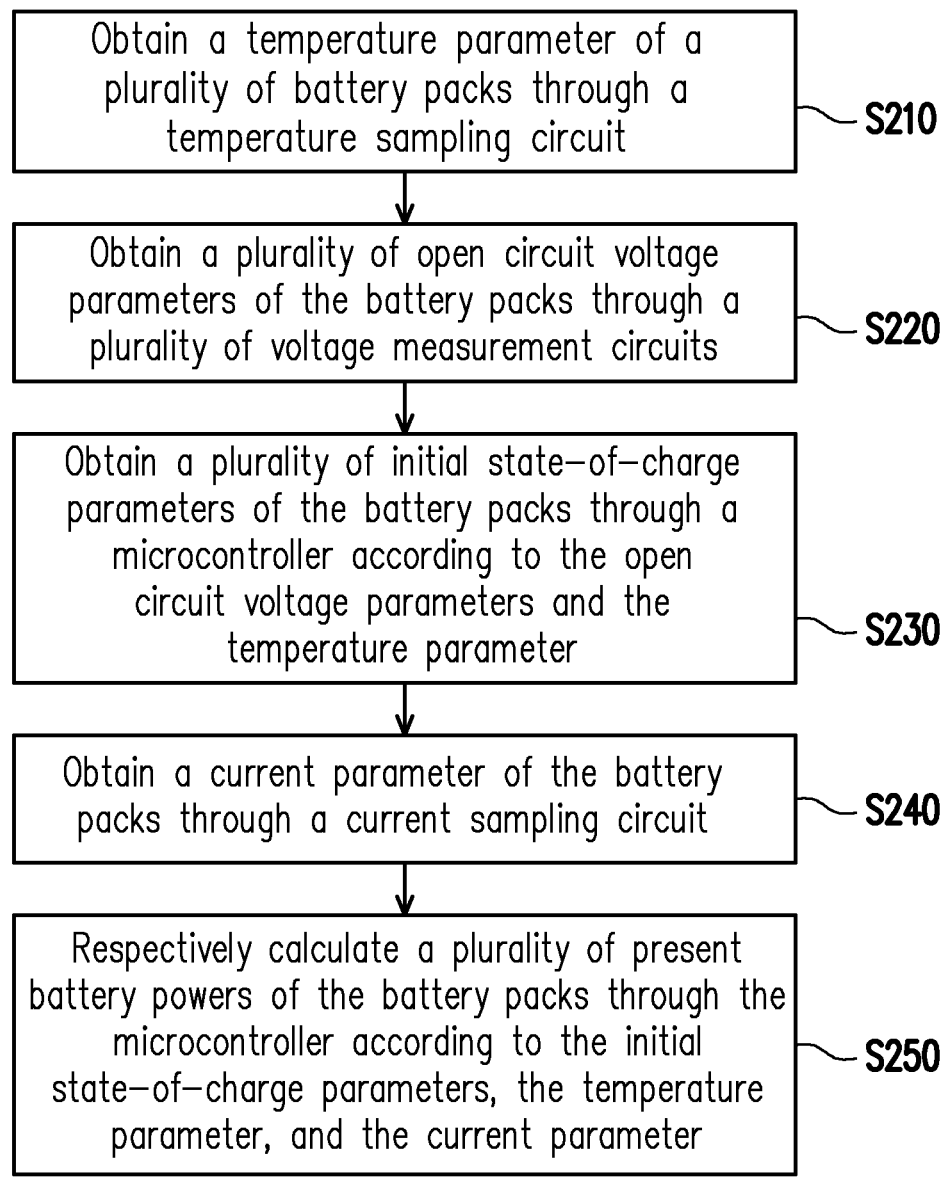
FIG. 2 is a flow chart of a battery management method according to an embodiment of the disclosure.

FIG. 2 is a flow chart of a battery management method according to an embodiment of the disclosure. Referring to FIG. 1 and FIG. 2, the battery management system 100 may perform the following Steps S210 to S250 to effectively estimate battery powers of the battery packs 200_1 to 200_N. In Step S210, the microcontroller 110 may obtain a temperature parameter (a present temperature) of the battery packs 200_1 to 200_N through the temperature sampling circuit 130. In Step S220, the microcontroller 110 may obtain multiple open circuit voltage (OCV) parameters (open circuit voltages at the present temperature) of the battery packs 200_1 to 200_N through the voltage measurement circuits 120_1 to 120_N. In Step S230, the microcontroller 110 may obtain multiple initial state-of-charge (SOC) parameters of the battery packs 200_1 to 200_N according to the open circuit voltage parameters and the temperature parameter.

Figure 3:
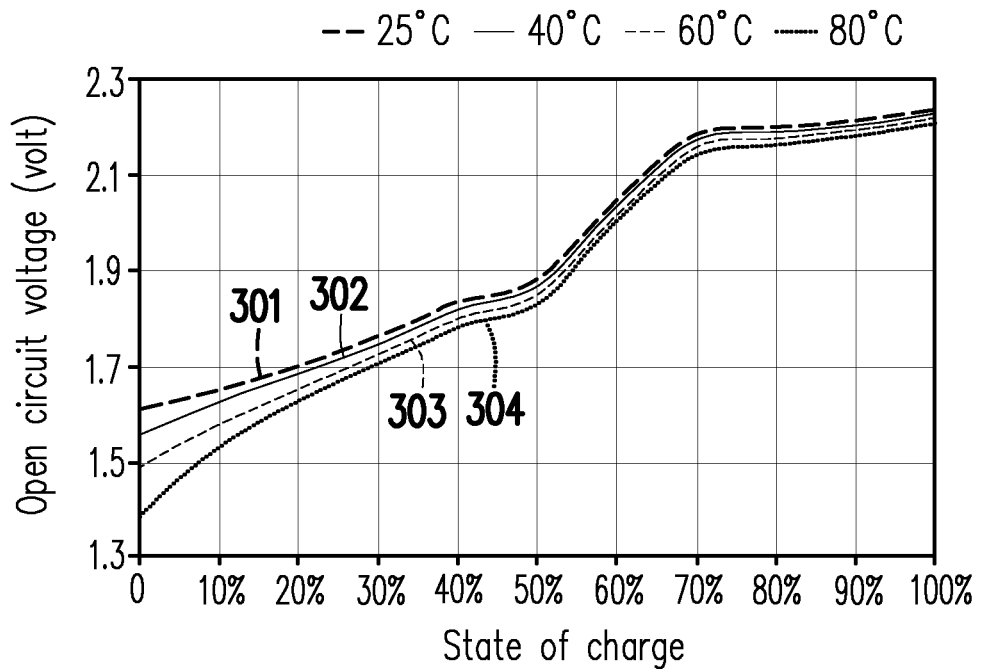
FIG. 3 is a relationship graph of a state of charge and an open circuit voltage according to an embodiment of the disclosure.

Referring to FIG. 3 together with FIG. 1 and FIG. 2, FIG. 3 is a relationship graph of an initial state of charge and an open circuit voltage according to an embodiment of the disclosure. For example, the relationship between the state of charge and the open circuit voltage of the battery packs 200_1 to 200_N may be non-linear due to different battery temperatures. The battery management system 100 may be pre-built in with battery parameter information (for example, stored in a storage unit of the battery management system 100 in a form of a look-up table) of the battery packs 200_1 to 200_N corresponding to the different temperatures as shown in FIG. 3. FIG. 3 may include relation curves 301 to 304 corresponding to the open circuit voltage and the state of charge, where the relation curves 301 to 304 may, for example, respectively correspond to temperatures of 25° C., 40° C., 60° C., and 80° C. Supposing that the present temperature of the battery packs 200_1 to 200_N which may be obtained by the microcontroller 110 through the temperature sampling circuit 130 is 40° C., and the open circuit voltage of a certain battery pack which may be obtained by the microcontroller 110 through a certain voltage measurement circuit is 1.8 volts, the microcontroller 110 may determine the initial state of charge of the certain battery pack as 40% through the relation curve 302 in FIG. 3. In other words, the microcontroller 110 may respectively obtain the corresponding initial state of charge according to the respective open circuit voltage of the battery packs 200_1~200_N. Therefore, the microcontroller 110 may accurately estimate the respective initial state of charge of the battery packs 200_1 to 200_N according to the open circuit voltage parameters changing with temperatures and the temperature parameter.

Figure 4:
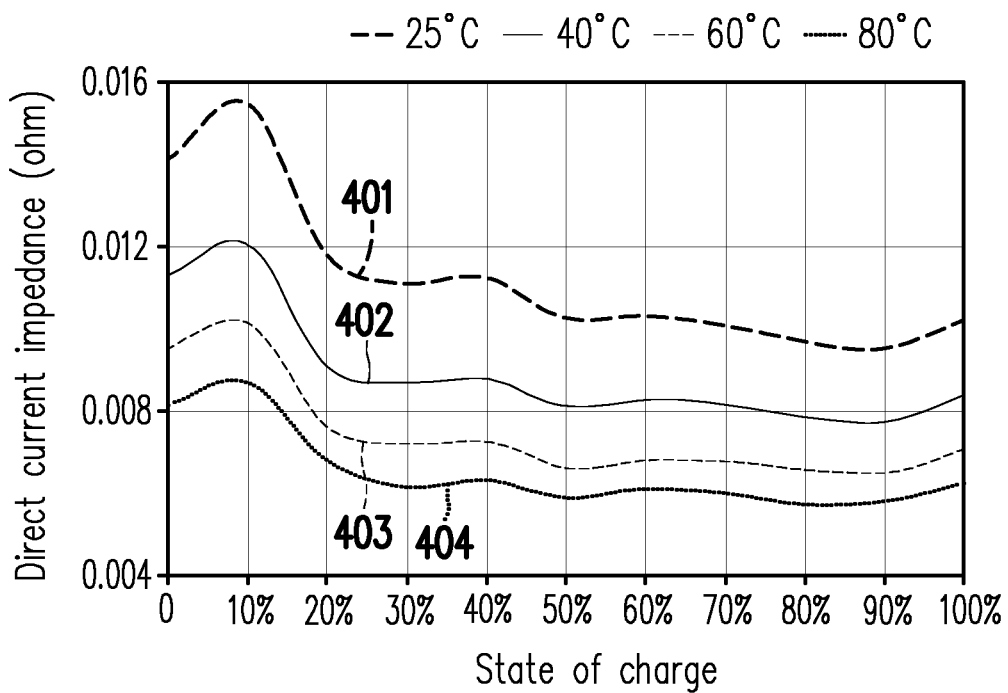
FIG. 4 is a relationship graph of a state of charge and a direct current impedance according to an embodiment of the disclosure.

In Step S240, the microcontroller 110 may obtain a current parameter of the battery packs 200_1 to 200_N through the current sampling circuit 140. In Step S250, the microcontroller 110 may respectively calculate multiple present battery powers (i.e., a present state of charge) of the battery packs 200_1 to 200_N through the Coulomb counting method according to the initial state-of-charge parameters, the temperature parameter, and the current parameter. In this regard, referring to FIG. 4 altogether, FIG. 4 is a relationship graph of a state of charge and a direct current impedance according to an embodiment of the disclosure. For example, the relationship between the state of charge and the direct current impedance of the battery packs 200_1 to 200_N may be non-linear due to different battery temperatures. The battery management system 100 may be pre-built in with battery parameter information (for example, stored in a storage unit of the battery management system 100 in a form of a look-up table) of the battery packs 200_1 to 200_N corresponding to the different temperatures as shown in FIG. 4. FIG. 4 may include relation curves 401 to 404 corresponding to the direct current impedance and the state of charge, where the relation curves 401 to 404 may, for example, respectively correspond to temperatures of 25° C., 40° C., 60° C., and 80° C. Supposing that the present temperature of the battery packs 200_1 to 200_N which may be obtained by the microcontroller 110 through the temperature sampling circuit 130 is 40° C., the microcontroller 110 may determine the direct current impedance of a certain battery pack as 0.0115 ohm according to the present temperature (40° C.) and the initial state of charge (40%) of the certain battery pack previously obtained through the relation curve 402 in FIG. 4. In other words, the microcontroller 110 may respectively obtain the corresponding direct current impedance according to the respective initial state of charge of the battery packs 200_1 to 200_N. Therefore, the battery management system 100 in the embodiment may accurately estimate the respective present battery powers (i.e., the present state of charge) of the battery packs 200_1 to 200_N according to the initial state-of-charge parameters changing with temperatures and the direct current impedance.

Further specifically, when the microcontroller 110 obtains another temperature parameter of a next timepoint through the temperature sampling circuit 130 and the another temperature parameter is different from the temperature parameter of the previous timepoint, the microcontroller 110 may also update the initial state-of-charge parameters of the battery packs 200_1 to 200_N according to another multiple open circuit voltage parameters corresponding to the another temperature parameter and another temperature parameter. Also, the microcontroller 110 may recalculate the present battery powers of the battery packs 200_1 to 200_N according to the updated initial state-of-charge parameters. Therefore, the battery management system 100 in the embodiment may instantaneously revise the initial state-of-charge parameters as temperature changes over time to keep accurately estimating the respective present battery powers of the battery packs 200_1 to 200_N.

It is worth noting that the battery packs 200_1 to 200_N in the embodiment may obtain battery discharge parameters such as a pulse discharge internal resistance, a pulse charging internal resistance, and a battery total internal resistance under a predetermined depth of discharge (DOD) through the calculation of Ohm's law via a hybrid pulse power characterization test (HPPC) under different temperature conditions in advance, and may utilize the least squares method to fit experimental data. Then, various battery performance data parameters such as an Ohm's internal resistance, a polarized resistor capacitor, and the open circuit voltage may be obtained by feeding curve fitting parameters of each stage of HPPC into a curve fitting algorithm. In this regard, a set of mathematical state-prediction model applicable to the aluminum-ion battery (or other aluminum energy storage devices, such as solid or liquid (electrolytic) capacitors, batteries, or supercapacitors made from aluminum material) at the different temperatures may be constructed in the embodiment, and the state of charge of the battery may be precisely predicted by utilizing a matrix estimation manner to estimate a parameter result for observing the changing situation of the state of charge of the battery.

Further specifically, the state of charge of the battery in the embodiment may be estimated based on, for example, the open-circuit voltage method and the Coulomb counting method, and the prediction and correction for the state of charge are to be performed accordingly. In this regard, in the process of estimating the state of charge of the battery, a state-of-charge model prediction matrix may be configured to estimate the state of charge of the battery in the embodiment. Moreover, through monitoring the battery voltages, the currents, and the temperatures, the state of charge is to be estimated according to the battery at different discharging temperatures, currents, and voltages. The state matrix of the state of charge may take the state of charge of the battery and a potential difference of the battery as state variable factors for prediction and correction, and the state-of-charge factors may be obtained by a non-linear systemic discreteness of the battery and a linearized parameter. Therefore, a battery equivalence model, constructed by relevant battery data generated by the HPPC, with an estimation process of the matrix estimation method may be configured to estimate the state of charge of the battery in the embodiment.

In addition, the battery equivalence model may be established by battery characteristics of different temperatures. The battery equivalence model may be, for example, a two-phase RC equivalent circuit model, but the disclosure is not limited thereto. It is worth noting that the establishment of the battery equivalence model in the embodiment may further take the influence of an electrochemical corrosion polarization and an electrolytic concentration polarization into consideration.

Figure 5:
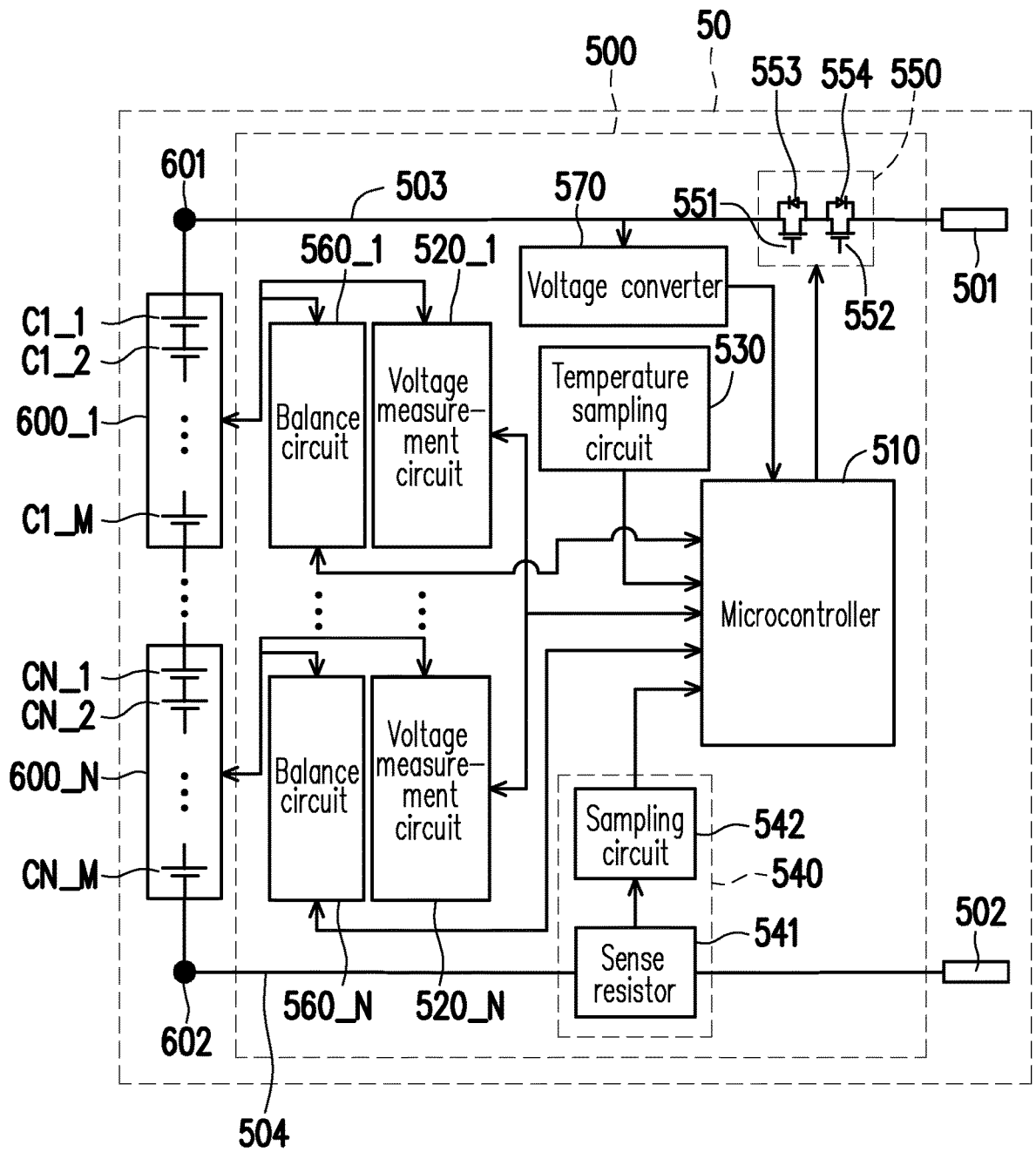
FIG. 5 is a schematic view of a battery management system according to another embodiment of the disclosure.

FIG. 5 is a schematic view of a battery management system according to another embodiment of the disclosure. Referring to FIG. 5, a battery management system 500 includes a microcontroller 510, multiple voltage measurement circuits 520_1 to 520_N, a temperature sampling circuit 530, a current sampling circuit 540, a protection circuit 550, multiple balance circuits 560_1 to 560_N, and a voltage converter 570. The battery management system 500 may be disposed in a battery module 50 and may be coupled to (electrically connected to) multiple battery packs 600_1 to 600_N to manage a battery state of the battery packs 600_1 to 600_N. In the embodiment, the microcontroller 510 is coupled to the voltage measurement circuits 520_1 to 520_N, the temperature sampling circuit 530, a sense resistor 541, the protection circuit 550, the balance circuits 560_1 to 560_N, and the voltage converter 570. The battery management system 500 is electrically connected between a load positive electrode 501 and a battery positive electrode 601 by a power line 503, and is electrically connected between a load negative electrode 502 and a battery negative electrode 602 by a power line 504. Besides, the battery packs 600_1 to 600_N may be coupled between the battery positive electrode 601 and the battery negative electrode 602. In the embodiment, the battery packs 600_1 to 600_N may respectively include multiple batteries C1_1 to CN_M connected in series, where N and M are positive integers, and the batteries C1_1 to CN_M are respectively single cells.

In the embodiment, the microcontroller 510 of the battery management system 500 may adopt a serial peripheral interface (SPI) to achieve a communication with the voltage measurement circuits 520_1 to 520_N and a load device coupled to the load positive electrode 501 and the load negative electrode 502. Also, the microcontroller 510 of the battery management system 500 may be connected to an external computer equipment through a universal asynchronous receiver/transmitter (UART) to enable the external computer equipment to record a firmware into the microcontroller 510. Besides, the external computer equipment may output instantaneous battery power information to a human machine interface through the UART to achieve a display and/or a recording function of the battery information. Nonetheless, the communication interface that may be adopted by the battery management system 500 in the disclosure is not limited to the above. In another embodiment, for example, an inter-integrated circuit (I2C), a controller area network (CAN), or other types of the communication interfaces may be adopted to achieve the connection interface or an outward connection interface between internal units of the battery management system 500.

In the embodiment, the voltage measurement circuits 520_1 to 520_N are respectively coupled to the battery packs 600_1 to 600_N one by one. The voltage measurement circuits 520_1 to 520_N may be respectively an analog front end (AFE) unit. The voltage measurement circuits 520_1 to 520_N may respectively include a battery monitor and a signal capturing unit. The respective signal capturing unit of the voltage measurement circuits 520_1 to 520_N may instantaneously capture multiple voltage signals of the battery packs 600_1 to 600_N, and the voltage parameters of the voltage signals may be monitored through the battery monitor to respectively judge whether the battery packs 600_1~600_N have occurred an overvoltage event or a low voltage event. The voltage measurement circuits 520_1 to 520_N may, for example, respectively detect 12 single cells connect in series (i.e., M=12). Furthermore, the voltage measurement circuits 520_1 to 520_N may be isolated from each other by a micro-transformer and may be connected to each other by a daisy chain. In this regard, the number of the circuits which may be stacked by the voltage measurement circuits 520_1 to 520_N may be, for example, 10 (i.e., N=10). In other words, the maximum number of the batteries managed under the framework may reach 120 units of series, and, for example, a wide range of 0 to 5 volts (V) for a voltage measurement function of a cell terminal may be provided.

In the embodiment, the voltage measurement circuits 520_1 to 520_N may respectively include a SPI module and an isolated (iso) SPI module. The voltage measurement circuits 520_1 to 520_N may be respectively connected to the microcontroller 510 through the individual SPI module, and the voltage measurement circuits 520_1 to 520_N may further be respectively connected to each other through the individual isolated (iso) SPI module to achieve a synchronous control function (such as a battery balance control). In the embodiment, the voltage measurement circuits 520_1 to 520_N may further respectively include a random access memory register (RAM register) configured to store related voltage sensing results or related control commands. In the embodiment, the balance circuits 560_1 to 560_N are respectively coupled to the battery packs 600_1 to 600_N one by one. The microcontroller 510 may include a battery balance control module and may receive the voltage measurement results of the battery packs 600_1 to 600_N provided by the voltage measurement circuits 520_1 to 520_N to judge whether the balance circuits 560_1 to 560_N are configured to balance battery powers of the battery packs 600_1 to 600_N.

In the embodiment, the current sampling circuit 540 may include the sense resistor 541 and a sampling circuit 542. The sense resistor 541 may be coupled to the power line 504 in series to enable the sampling circuit 542 to calculate the current parameter flowing through the power line 504 through sampling a voltage change on the sense resistor 541. However, in another embodiment, the current sampling circuit 540 may also be implemented by a Hall element. In the embodiment, the microcontroller 510 may include a system on a chip (SOC) counter and may receive current measurement results of the battery packs 600_1 to 600_N provided by the sampling circuit 542 to calculate the battery powers of the battery packs 600_1 to 600_N.

In the embodiment, the protection circuit 550 may include switching transistors 551 and 552 and diodes 553 and 554. The switching transistors 551 and 552 may be respectively a p-type metal oxide semiconductor field effect transistor (MOSFET), but the disclosure is not limited thereto. A first terminal of the switching transistor 551 is coupled to a battery positive electrode 601 and a negative pole of the diode 553, and a second terminal of the switching transistor 551 is coupled to a first terminal of the switching transistor 552, a positive pole of the diode 553, and a positive pole of the diode 554. The first terminal of the switching transistor 552 is coupled to the positive pole of the diode 553 and the positive pole of the diode 554, and a second terminal of the switching transistor 552 is coupled to the load positive electrode 501 and a negative pole of the diode 554.

In the embodiment, when the battery packs 600_1 to 600_N are in a normal state, the microcontroller 510 may control the switching transistor 551 and the switching transistor 552 to be in a conduction state to enable the switching transistor 551 and the switching transistor 552 to form a discharge loop and/or a charge loop. In this way, a discharge current received by the battery positive electrode 601 from the battery packs 600_1 to 600_N may be provided to the load positive electrode 501 through the switching transistor 551 and the switching transistor 552, that is, the battery packs 600_1 to 600_N may be allowed to discharge to the load device. The load positive electrode 501 may provide a charge current to the battery positive electrode 601 through the switching transistor 551 and the switching transistor 552, that is, the load device may be allowed to charge the battery packs 600_1 to 600_N.

In the embodiment, when the battery packs 600_1 to 600_N are in an over-discharge state due to an abnormal discharge, the microcontroller 510 may control the switching transistor 551 to be in a non-conduction state to close the discharge loop. At this moment, the microcontroller 510 may control the switching transistor 552 to maintain the conduction state. In this way, the battery packs 600_1 to 600_N may not be discharged to the load device, but the load device may be allowed to charge the battery packs 600_1 to 600_N. The charge current received by the load positive electrode 501 from the load device may be provided to the battery positive electrode 601 through the switching transistor 552 and the diode 553 to charge the battery packs 600_1 to 600_N. Until when the battery voltages are raised to a low voltage resetting value, the microcontroller 510 may control the switching transistor 551 to return to the conduction state to enable the battery packs 600_1 to 600_N to discharge to the load device again.

In the embodiment, when the battery packs 600_1 to 600_N are in an over-charge state due to the occurrence of the over charge, the microcontroller 510 may control the switching transistor 552 to be in the non-conduction state to close the charge loop. At this moment, the microcontroller 510 may control the switching transistor 551 to maintain the conduction state. In this way, the load device does not charge the battery packs 600_1 to 600_N, but the battery packs 600_1 to 600_N may be allowed to discharge to the load device. The discharge current of the battery packs 600_1 to 600_N may be provided to the load positive electrode 501 via the battery positive electrode 601, the switching transistor 551, and the diode 554 for discharge. Until when the battery voltages decline to a high voltage resetting value, the microcontroller 510 may control the switching transistor 552 to return to the conduction state to enable the load device to charge the battery packs 600_1 to 600_N again.

In the embodiment, the microcontroller 510 may include a protection control circuit and a transistor driver. The transistor driver may output two control signals to respective control terminals of the switching transistor 551 and the switching transistor 552. In this regard, the protection control circuit may judge whether an abnormal event occurs according to the voltage measurement results, a temperature measurement result, and the current measurement result of the battery packs 600_1 to 600_N respectively provided by the voltage measurement circuits 520_1 to 520_N, the temperature sampling circuit 530, and the sampling circuit 542 to conduct or close the loop through operating the switching transistor 551 and the switching transistor 552 by the transistor driver.

In the embodiment, the voltage converter 570 may be a direct current to direct current converter (DC to DC converter) to provide a direct-current voltage conversion function. The voltage converter 570 is coupled to the power line 503 and may obtain direct-current voltage signals provided by the battery packs 600_1 to 600_N. The voltage converter 570 may convert the direct-current voltage signals into power voltages that may drive the microcontroller 510 and may provide the power voltages to the microcontroller 510. Moreover, in another embodiment, the microcontroller 510 may further include, for example, a SPI interface module and a pre-charge module. The microcontroller 510 may be connected to other functional circuits and an external load device through the SPI interface module. The microcontroller 510 may pre-charge the battery packs 600_1 to 600_N through the pre-charge module.

Figure 6A:
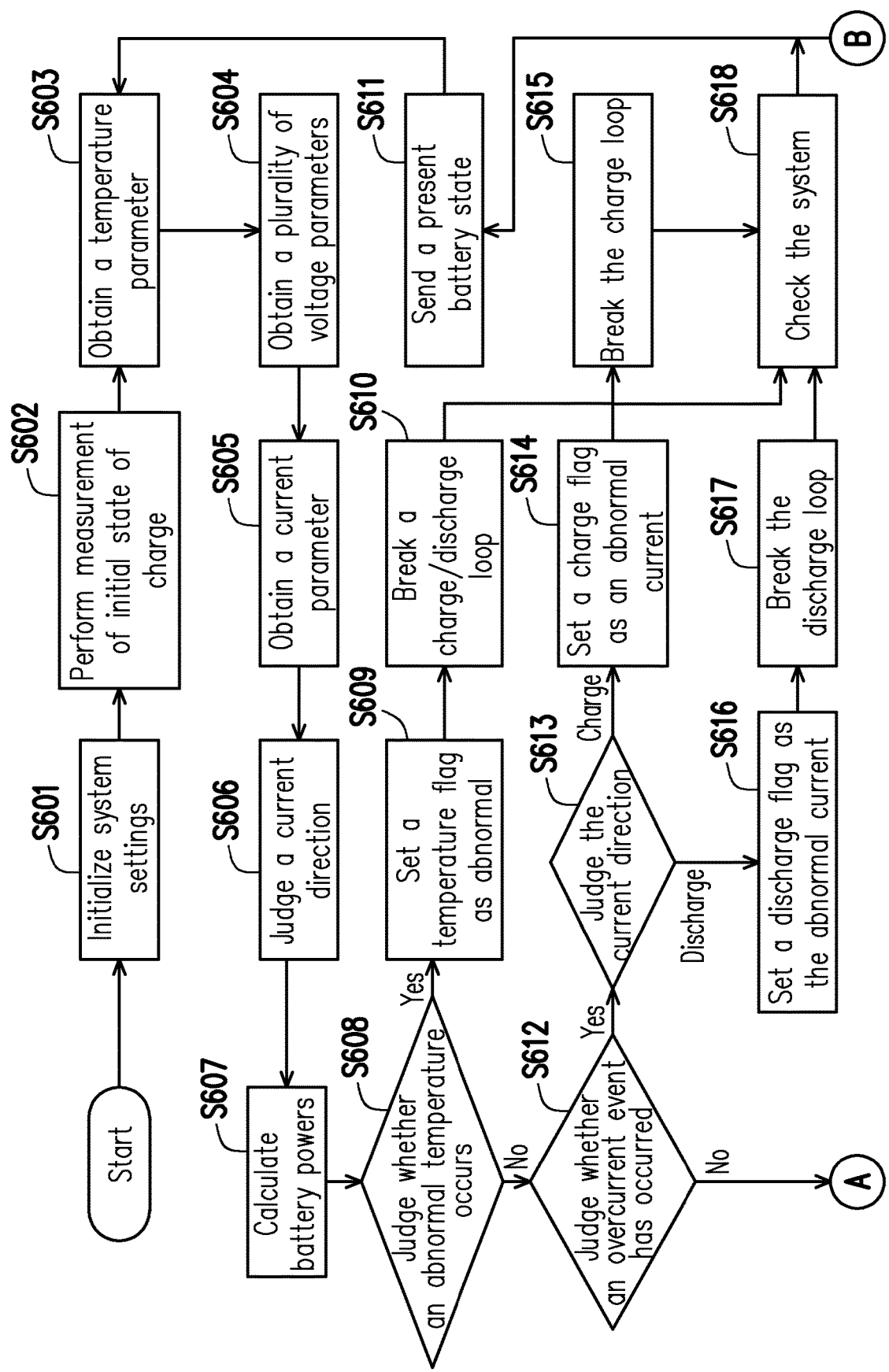
FIG. 6A, FIG. 6B, and FIG. 6C are flow charts of a battery management method according to another embodiment of the disclosure.
Figure 6B:
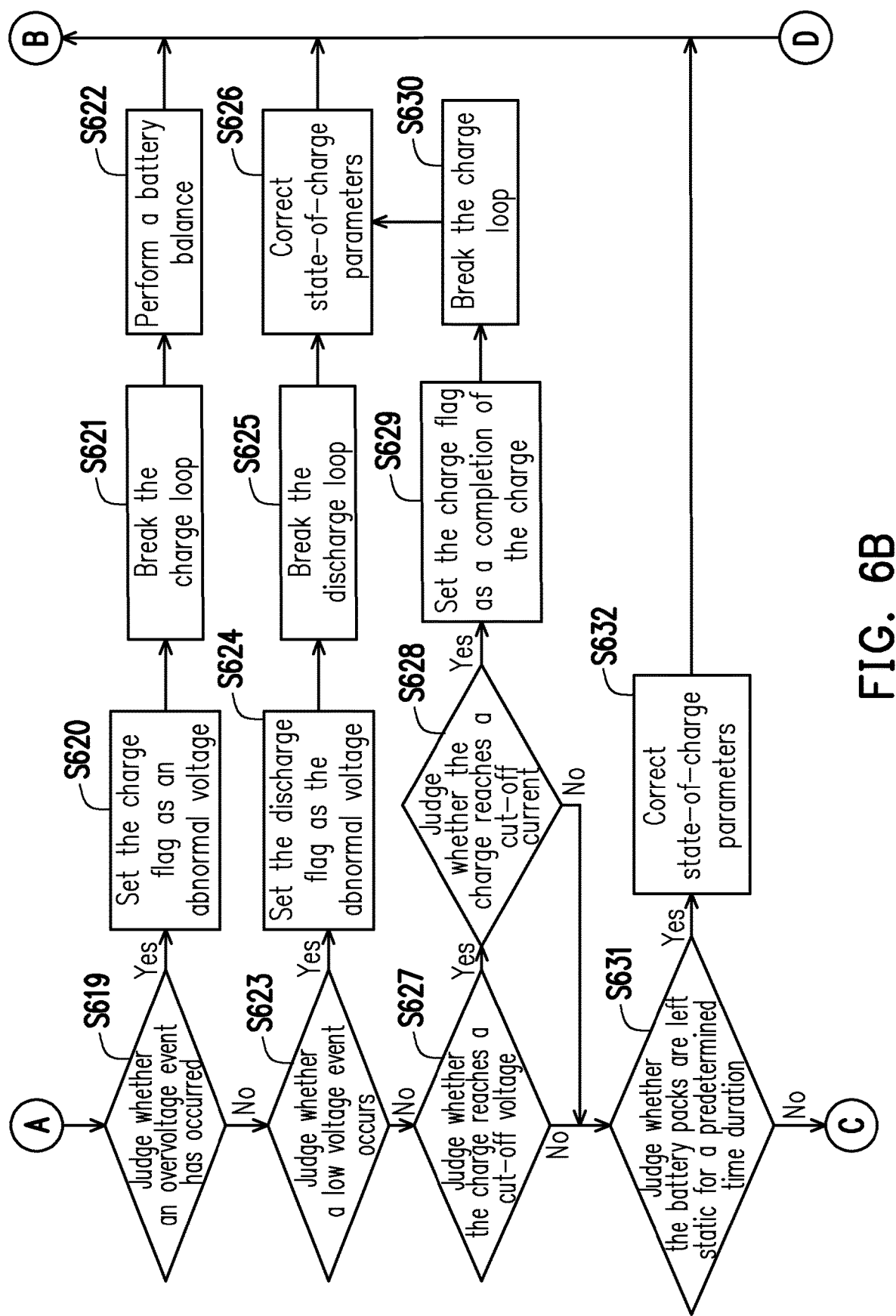
Figure 6C:
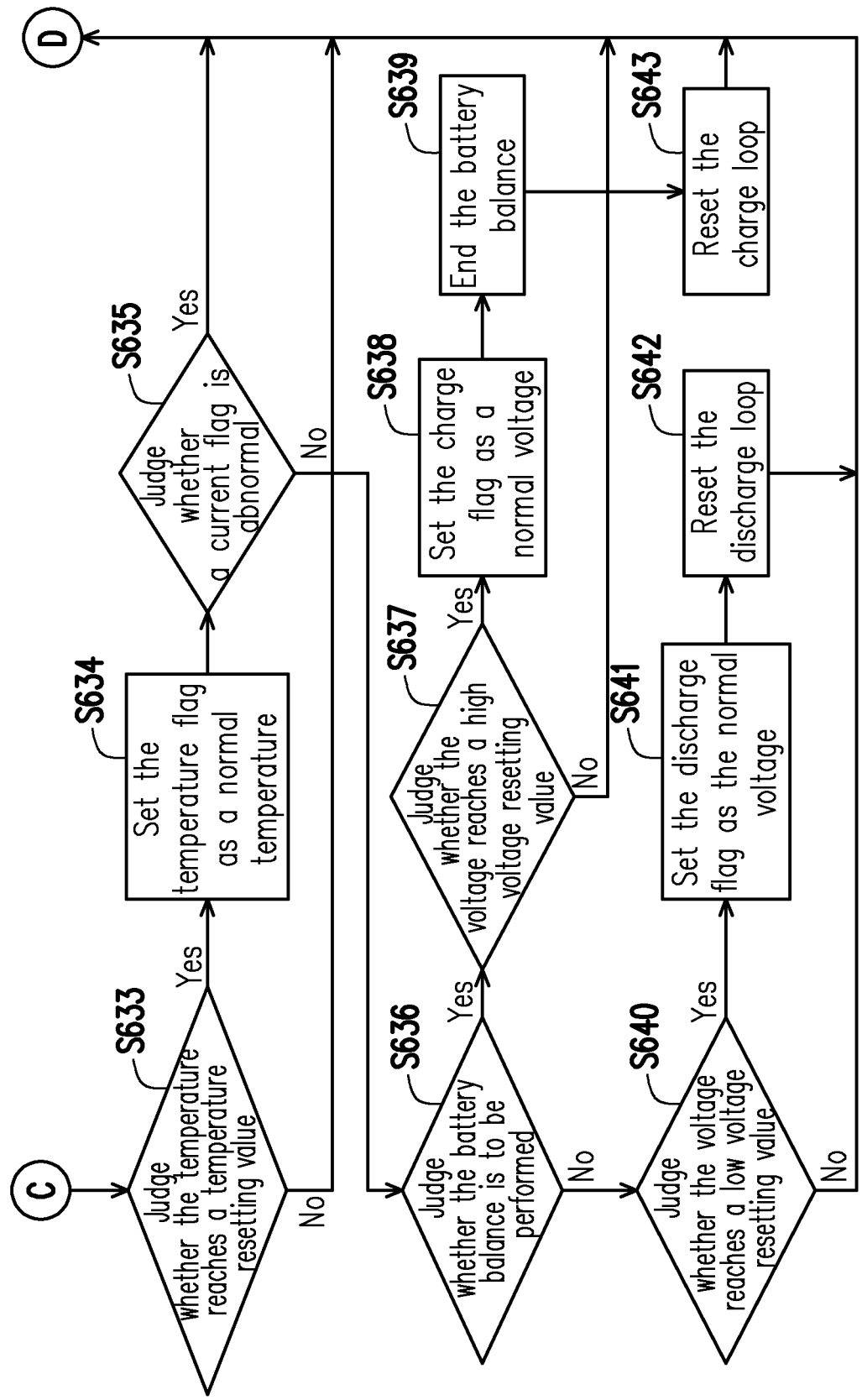

FIG. 6A, FIG. 6B, and FIG. 6C are flow charts of a battery management method according to another embodiment of the disclosure. Referring to FIG. 5, FIG. 6A, FIG. 6B, and FIG. 6C, the battery management system 500 may perform the following Steps S601 to S643 to achieve the battery management and protection functions. It is worth noting that the microcontroller 510 may record data with multiple flags to indicate present operating state of the battery and may update the present battery state to the load device. The load device may determine to perform corresponding operation on the battery packs 600_1 to 600_N according to the present battery state, and when the corresponding operation is completed, the load device (or the microcontroller 510 automatically updates) may update the data with the flags recorded by the microcontroller 510.

In Step S601, the microcontroller 510 initializes system settings to load related control commands and protection parameters. In Step S602, the microcontroller 510 performs the measurement of the initial state of charge to obtain the respective initial state-of-charge parameters of the battery packs 600_1 to 600_N according to the respective open circuit voltage parameters of the battery packs 600_1 to 600_N. In Step S603, the microcontroller 510 may obtain a temperature parameter of the battery packs 600_1~600_N through the temperature sampling circuit 530. In Step S604, the microcontroller 510 may obtain the voltage parameters of the battery packs 600_1 to 600_N through the voltage measurement circuits 520_1 to 520_N. In Step S605, the microcontroller 510 may obtain a current parameter of the battery packs 600_1 to 600_N through the current sampling circuit 540. In Step S606, the microcontroller 510 may judge a current direction on the power line 504 through the current sampling circuit 540 to judge whether the present operating state of the battery packs 600_1 to 600_N is a charge mode, a discharge mode, or a static mode. In Step S607, the microcontroller 510 may calculate present battery powers of the battery packs 600_1 to 600_N according to the temperature parameter, the voltage parameters, and the current parameter. In this regard, the calculation method of the present battery powers of the battery packs 600_1 to 600_N may be referred to the description of the above-mentioned embodiments in FIG. 1 to FIG. 4, so there is no repetition here.

In Step S608, the microcontroller 510 may judge whether an abnormal temperature occurs through the temperature sampling circuit 530. If the abnormal temperature occurs, then in Step S609, the microcontroller 510 may set a temperature flag as abnormal. In Step S610, the microcontroller 510 may operate the protection circuit 550 to break the charge/discharge loop. In Step S618, the microcontroller 510 may automatically check the system or remind a user to check the battery module 50 by means. In Step S611, the microcontroller 510 may send the present battery state to the load device to enable the load device to perform the corresponding operation according to the present battery state. Next, the microcontroller 510 may perform Step S603 and may recursively update the present battery powers of the battery packs 600_1 to 600_N via Steps S603~S607.

If the abnormal temperature does not occur, in Step S612, the microcontroller 510 may judge whether an overcurrent event has occurred through the current sampling circuit 540. If the overcurrent event has occurred, then in Step S613, the microcontroller 510 judges the current direction. If the present operation of the battery packs 600_1 to 600_N is in the charge mode, then in Step S614, the microcontroller 510 may set a charge flag as an abnormal current. In Step S615, the microcontroller 510 may operate the protection circuit 550 to break the charge loop. Relatively, if the present operation of the battery packs 600_1 to 600_N is in the discharge mode, then in Step S616, the microcontroller 510 may set a discharge flag as the abnormal current. In Step S617, the microcontroller 510 may operate the protection circuit 550 to break the discharge loop. Next, the microcontroller 510 may perform S618, S611, and S603~S607 to recursively update the present battery powers of the battery packs 600_1 to 600_N.

If the overcurrent event has not occurred, in Step S619, the microcontroller 510 may judge whether the overvoltage event has occurred through the voltage measurement circuits 520_1 to 520_N. If the overvoltage event has occurred in at least one of the present battery packs 600_1 to 600_N, then in Step S620, the microcontroller 510 may set the charge flag as an abnormal voltage. In Step S621, the microcontroller 510 may operate the protection circuit 550 to break the charge loop. In Step S622, the microcontroller 510 may operate at least one of the corresponding balance circuits 560_1 to 560_N to perform a battery balance. Next, the controller 510 may perform S611, S603~S607 to notify the load device to perform the corresponding operation and may recursively update the present battery powers of the battery packs 600_1 to 600_N.

If the overvoltage event has not occurred, in Step S623, the microcontroller 510 may judge whether the low voltage event has occurred through the voltage measurement circuits 520_1 to 520_N. If the low voltage event occurs in the at least one of the present battery packs 600_1 to 600_N, then in Step S624, the microcontroller 510 may set the discharge flag as the abnormal voltage. In Step S625, the microcontroller 510 may operate the protection circuit 550 to break the discharge loop. In Step S626, the microcontroller 510 may correct the initial state-of-charge parameters due to an excessive discharge of the battery packs 600_1 to 600_N. Next, the controller 510 may perform S611, S603~S607 to notify the load device to perform the corresponding operation and may recursively update the present battery powers of the battery packs 600_1 to 600_N.

If the low voltage event has not occurred, in Step S627 and Step S628, the microcontroller 510 may judge whether the charge reaches a cut-off voltage and/or a cut-off current through the voltage measurement circuits 520_1 to 520_N and the current sampling circuit 540. If the charge reaches the cut-off voltage and the cut-off current, then in Step S629, the microcontroller 510 may set the charge flag as a completion of the charge. In Step S630, the microcontroller 510 may operate the protection circuit 550 to break the charge loop. Next, the controller 510 may perform S611, S603~S607 to notify the load device to perform the corresponding operation and may recursively update the present battery powers of the battery packs 600_1 to 600_N.

If the charge does not reach the cut-off voltage or the cut-off current, in Step S631, the microcontroller 510 may judge whether the battery packs 600_1 to 600_N are left static for a predetermined time duration (for example, 12 hours). If the battery packs 600_1 to 600_N are left static for the predetermined time duration, in Step S632, the microcontroller 510 may correct the initial state-of-charge parameters. Next, the controller 510 may perform S611, S603~S607 to notify the load device to perform the corresponding operation and may recursively update the present battery powers of the battery packs 600_1 to 600_N.

If the battery packs 600_1 to 600_N are not left static for the predetermined time duration, in Step S633, the microcontroller 510 may judge whether the temperature of the battery packs 600_1 to 600_N reaches a temperature resetting value through the temperature sampling circuit 530. If the temperature of the battery packs 600_1 to 600_N reaches the temperature resetting value, then the microcontroller 510 may set the temperature flag as a normal temperature. In Step S635, the microcontroller 510 may judge whether a current flag is abnormal. If so, the microcontroller 510 may perform S611, S603~S607 to notify the load device to perform the corresponding operation and may recursively update the present battery powers of the battery packs 600_1 to 600_N. If the temperature of the battery packs 600_1 to 600_N does not reach the temperature resetting value, then the microcontroller 510 may perform S611, S603~S607 to notify the load device to perform the corresponding operation and may recursively update the present battery powers of the battery packs 600_1 to 600_N.

If the current flag is not abnormal, then in Step S636, the microcontroller 510 may judge whether the battery balance is to be performed. If the battery packs 600_1 to 600_N are performing the battery balance, then in Step S637, the microcontroller 510 may judge whether the voltages of the battery packs 600_1 to 600_N reach a high voltage resetting value through the voltage measurement circuits 520_1 to 520_N. If the voltages of the battery packs 600_1 to 600_N reach the high voltage resetting value, then in Step S638, the microcontroller 510 may set the charge flag as a normal voltage. In Step S639, the microcontroller 510 may end the battery balance operation. In Step S643, the microcontroller 510 may operate the protection circuit 550 to reset the charge loop (may continue to charge). Next, the microcontroller 510 may perform S611, S603~S607 to notify the load device to perform the corresponding operation and may recursively update the present battery powers of the battery packs 600_1 to 600_N.

If the voltages of the battery packs 600_1 to 600_N do not reach the high voltage resetting value, then in Step S640, the microcontroller 510 may judge whether the voltages of the battery packs 600_1 to 600_N reach a low voltage resetting value through the voltage measurement circuits 520_1 to 520_N. If the voltages of the battery packs 600_1 to 600_N reach the low voltage resetting value, then in Step S641, the microcontroller 510 may set the discharge flag as the normal voltage. In Step S642, the microcontroller 510 may operate the protection circuit 550 to reset the discharge loop (may continue to discharge). If the voltages of the battery packs 600_1 to 600_N do not reach the low voltage resetting value, the microcontroller 510 may perform S611, S603~S607 to notify the load device to perform the corresponding operation and may recursively update the present battery powers of the battery packs 600_1~600_N.

In summary of the above, the battery management system and the battery management method of the disclosure can instantaneously monitor the voltage parameters, the current parameter, and the temperature parameter of the battery packs to achieve protection mechanisms for an overvoltage, an overcurrent, or an overtemperature. The battery management system and the battery management method of the disclosure can consider the influence of the temperature on the state of charge of the battery and thus can automatically update the initial state of charge of the battery packs to accurately estimate the present battery powers of the battery packs. In addition, the battery management system of the disclosure can achieve a stackable modular design to be adapted to apply to diverse fields and diverse storage batteries, and the battery management system of the disclosure can further achieve the battery balance function. Therefore, the battery management system and the battery management method of the disclosure can further have an effect of extending lifetime of the storage batteries.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A battery management system, comprising:
   a temperature sampling circuit, configured to obtain a temperature parameter of a plurality of battery packs;
   a plurality of voltage measurement circuits, respectively coupled to the battery packs and configured to obtain a plurality of open circuit voltage parameters of the battery packs;
   a current sampling circuit, coupled to the battery packs and configured to obtain a current parameter of the battery packs; and
   a microcontroller, coupled to the voltage measurement circuits, the current sampling circuit, and the temperature sampling circuit,
   wherein the microcontroller obtains a plurality of initial state-of-charge parameters of the battery packs according to the open circuit voltage parameters and the temperature parameter and respectively calculates a plurality of present battery powers of the battery packs according to the initial state-of-charge parameters, the temperature parameter, and the current parameter.

2. The battery management system according to claim 1, wherein the microcontroller uses the open circuit voltage parameters and the temperature parameter to search a battery parameter table to obtain the initial state-of-charge parameters,
   wherein the battery packs construct a corresponding battery equivalence model via a hybrid pulse power characterization test in advance, and the battery parameter table is established by inputting a plurality of battery model parameters corresponding to different temperatures into the battery equivalence model.

3. The battery management system according to claim 1, wherein when the temperature sampling circuit obtains an another temperature parameter of a next timepoint, the microcontroller updates the initial state-of-charge parameters of the battery packs according to the open circuit voltage parameters and the another temperature parameter and recalculates the present battery powers of the battery packs according to the updated initial state-of-charge parameters.

4. The battery management system according to claim 1, further comprising:
a protection circuit, coupled to the battery packs and the microcontroller,
wherein when the microcontroller judges that the battery packs are in an abnormal temperature state according to the temperature parameter, the microcontroller operates the protection circuit to break a charge/discharge loop of the battery packs.

5. The battery management system according to claim 4, wherein when the microcontroller judges that the battery packs are in an overcurrent state according to the current parameter, the microcontroller judges that the battery packs are performing a charge operation or a discharge operation according to the current parameter, and the microcontroller operates the protection circuit to break the charge loop or the discharge loop of the battery packs.

6. The battery management system according to claim 4, further comprising:
a plurality of balance circuits, respectively coupled to the battery packs and the microcontroller,
wherein the microcontroller obtains a plurality of voltage parameters of the battery packs through the voltage measurement circuits, when the microcontroller judges that at least one of the battery packs is in an overvoltage state according to the voltage parameters, the microcontroller operates the protection circuit to break the charge loop of the battery packs, and the microcontroller operates at least one of the corresponding balance circuits to perform a battery balance operation on the at least one of the battery packs.

7. The battery management system according to claim 4, wherein the microcontroller obtains a plurality of voltage parameters of the battery packs through the voltage measurement circuits, when the microcontroller judges that at least one of the battery packs is in a low voltage state according to the voltage parameters, the microcontroller operates the protection circuit to break the discharge loop of the battery packs, and the microcontroller corrects the initial state-of-charge parameters corresponding to the at least one of the battery packs.

8. The battery management system according to claim 4, wherein the microcontroller obtains a plurality of present voltage parameters of the battery packs through the voltage measurement circuits, and the microcontroller obtains a present current parameter of the battery packs through the current sampling circuit, when the microcontroller judges that the present voltage parameters reach a cut-off voltage and the present current parameter reaches a cut-off current, the microcontroller operates the protection circuit to break the charge loop of the battery packs and corrects the initial state-of-charge parameters corresponding to the battery packs.

9. The battery management system according to claim 1, wherein the battery packs respectively comprise a plurality of aluminum-ion batteries connected in series.

10. A battery management method, comprising:
obtaining a temperature parameter of a plurality of battery packs through a temperature sampling circuit;
obtaining a plurality of open circuit voltage parameters of the battery packs through a plurality of voltage measurement circuits coupled to the battery packs;
obtaining a plurality of initial state-of-charge parameters of the battery packs through a microcontroller coupled to the voltage measurement circuits and the temperature sampling circuit according to the open circuit voltage parameters and the temperature parameter;
obtaining a current parameter of the battery packs through a current sampling circuit coupled to the battery packs and the microcontroller; and
respectively calculating a plurality of present battery powers of the battery packs through the microcontroller according to the initial state-of-charge parameters, the temperature parameter, and the current parameter.

11. The battery management method according to claim 10, wherein obtaining the open circuit voltage parameters of the battery packs comprises:
searching a battery parameter table using the open circuit voltage parameters and the temperature parameter through the microcontroller to obtain the initial state-of-charge parameters,
wherein the battery packs construct a corresponding battery equivalence model through a hybrid pulse power characterization test in advance, and the battery parameter table is established by inputting a plurality of battery model parameters corresponding to different temperatures into the battery equivalence model.

12. The battery management method according to claim 10, further comprising:
when the temperature sampling circuit obtains an another temperature parameter of a next timepoint, updating the initial state-of-charge parameters of the battery packs through the microcontroller according to the open circuit voltage parameters and the another temperature parameter; and
recalculating the present battery powers of the battery packs through the microcontroller according to the updated initial state-of-charge parameters.

13. The battery management method according to claim 10, further comprising:
when the microcontroller judges that the battery packs are in an abnormal temperature state according to the temperature parameter, operating a protection circuit coupled to the battery packs through the microcontroller to break a charge/discharge loop of the battery packs.

14. The battery management method according to claim 13, further comprising:
when the microcontroller judges that the battery packs are in an overcurrent state according to the current parameter, judging whether the battery packs are performing a charge operation or a discharge operation through the microcontroller according to the current parameter, and operating the protection circuit to break the charge loop or the discharge loop of the battery packs.

15. The battery management method according to claim 13, further comprising:
obtaining a plurality of voltage parameters of the battery packs through the voltage measurement circuits;
when the microcontroller judges that at least one of the battery packs is in an overvoltage state according to the voltage parameters, operating the protection circuit through the microcontroller to break the charge loop of the battery packs; and
operating at least one of a plurality of corresponding balance circuits coupled to the battery packs through the microcontroller to perform a battery balance operation on the at least one of the battery packs.

16. The battery management method according to claim 13, further comprising:

obtaining a plurality of voltage parameters of the battery packs through the voltage measurement circuits;

when the microcontroller judges that at least one of the battery packs is in a low voltage state according to the voltage parameters, operating the protection circuit through the microcontroller to break the discharge loop of the battery packs; and correcting the initial state-of-charge parameters corresponding to the at least one of the battery packs through the microcontroller.

17. The battery management method according to claim 13, further comprising:

obtaining a plurality of present voltage parameters of the battery packs through the voltage measurement circuits;

obtaining a present current parameter of the battery packs through the current sampling circuit;

when the microcontroller judges that the present voltage parameters reach a cut-off voltage and the present current parameter reaches a cut-off current, operating the protection circuit through the microcontroller to break the charge loop of the battery packs; and correcting the initial state-of-charge parameters corresponding to the battery packs through the microcontroller.

18. The battery management method according to claim 10, further comprising:

when the microcontroller judges that the battery packs are left static for a predetermined time duration, correcting the initial state-of-charge parameters corresponding to the battery packs through the microcontroller, the predetermined time duration is 12 hours.

19. The battery management method according to claim 10, wherein the battery packs respectively comprise a plurality of aluminum-ion batteries connected in series.

* * * * *